US012808841B2

(12) United States Patent
Chen et al.

(10) Patent No.: US 12,808,841 B2
(45) Date of Patent: Nov. 24, 2026

(54) MEMS pH SENSOR

(71) Applicants: Chih-Chang Chen, Cupertino, CA (US); Liji Huang, Santa Clara, CA (US)

(72) Inventors: Chih-Chang Chen, Cupertino, CA (US); Liji Huang, Santa Clara, CA (US)

(73) Assignee: Siargo Ltd., Santa Clara, CA (US)

( * ) Notice: Subject to any disclaimer, the term of this patent is extended or adjusted under 35 U.S.C. 154(b) by 164 days.

(21) Appl. No.: 18/971,780

(22) Filed: Dec. 6, 2024

(65) Prior Publication Data

US 2026/0160728 A1 Jun. 11, 2026

(51) Int. Cl.

*G01N 27/414* (2006.01)
*C23C 16/34* (2006.01)
*C23C 16/50* (2006.01)
*G01N 27/333* (2006.01)
*G01N 27/416* (2006.01)
*G03F 7/00* (2006.01)

(52) U.S. Cl.

CPC ....... *G01N 27/4148* (2013.01); *C23C 16/345* (2013.01); *C23C 16/50* (2013.01); *G01N 27/333* (2013.01); *G01N 27/4167* (2013.01); *G03F 7/0035* (2013.01)

(58) Field of Classification Search

None

See application file for complete search history.

(56) References Cited

PUBLICATIONS

KB Parizi, et al., "Exceeding Nemst limit (59mV/pH): CMOS-based pH sensor for autonomous application", In 2012 International Electron Devices Meeting, IEEE, pp. 24-27, Dec. 10, 2012.*

* cited by examiner

*Primary Examiner* — J. Christopher Ball

(57) ABSTRACT

A low cost of pH sensor with differential sensing of two external gates of metal oxide semiconductor field effect transistors is disclosed. The MEMS pH sensor utilizes two distinct hydrogen ion sensing electrodes which are formed by popular metal oxide films as the hydrogen ion sensitive material. The gate terminals of the two identical commercially available MOSFETs are connected to the two hydrogen ion sensing electrodes to form two electrochemical measurement cells in conjunction with a common reference electrode. Variations in the pH of the solution in contact with the hydrogen ion sensitive electrodes are detected by the MOSFET due to changes in surface potential at its gate terminal. The common reference electrode formed by a thin film of noble metal is designed for the differential sensing, which can help mitigate long-term drift, common-mode disturbances and eliminate the need for a glass or solid state reference electrode.

16 Claims, 8 Drawing Sheets

MEMS pH SENSOR

BACKGROUND OF THE INVENTION

Figure 1:
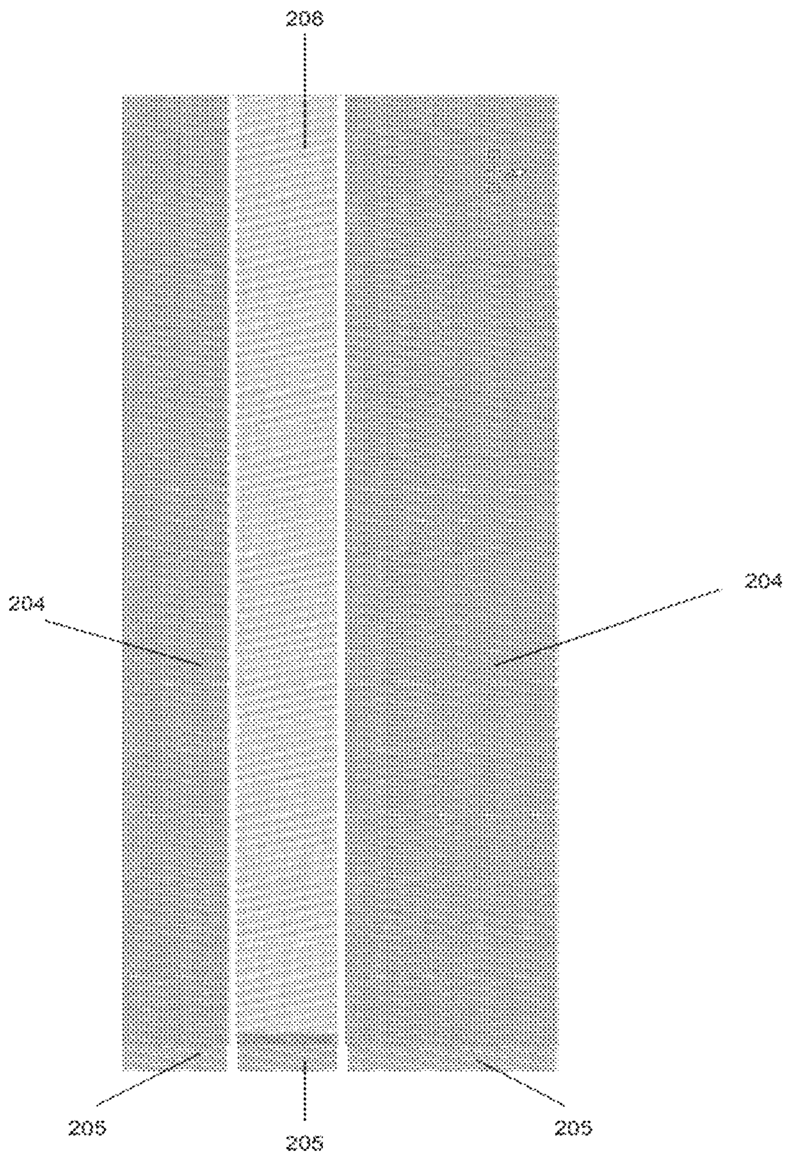

A pH sensor, often called a probe or electrode, is a device used to measure the acidity or alkalinity of a solution by detecting the concentration of dissolved hydrogen ions. It plays a crucial role in various industries and research areas, such as water treatment, chemical manufacturing, food production, and environmental monitoring.

The development of the pH sensor is largely attributed to Arnold O. Beckman, who, in 1934, invented the first commercially successful electronic PH meter while working at the California Institute of Technology. This invention was prompted by a request from the California Fruit Growers Exchange (Sunkist) to create a reliable method for accurately measuring the acidity of lemon juice. The concept of pH was first introduced by Danish chemist S. P. L. Sørensen in 1909. Before Beckman's invention, pH was primarily measured using colorimetric methods, such as litmus paper, which lacked precision. Beckman's first pH meter, initially called an "acidimeter," was designed to be far more robust and reliable than earlier techniques. This invention had a significant impact across various industries, including food processing, where precise pH control is essential. Over the years, advancements in electrode design and electronics have made pH sensors significantly portable, accurate, and user-friendly.

There are three main types of pH meters. The benchtop pH meters, commonly used in laboratories, are designed for analyzing samples brought to the meter. The portable or field pH meters are handheld devices used to measure pH on-site, whether in the field or at a production facility. The in-line or in situ pH meters, also known as pH analyzers, continuously monitor pH within a process and can either operate independently or connect to a central system for process control.

pH meters vary from simple, affordable pen-like devices to sophisticated laboratory instruments with computer interfaces and multiple inputs to adjust for temperature-related pH variations. These devices may offer digital or analog outputs and can be battery-powered or line-powered, with some models utilizing telemetry to connect electrodes to the display.

Specialized meters and probes are available for specific applications, such as harsh industrial environments or biological microenvironments. Additionally, holographic pH sensors allow colorimetric pH measurement using various pH indicators. There are also solid-state pH meters on the market, which utilize solid-state electrodes instead of traditional glass electrodes. The present invention discloses an innovative solid-state pH sensor with advantages of low cost for fabrication.

SUMMARY OF THE INVENTION

Since the 1970s, Ton-Sensitive Field Effect Transistors (ISFETs) have been researched and developed as alternatives to conventional pH glass electrodes. An ISFET is a field-effect transistor with an ion-sensitive gate insulator exposed to the solution to be analyzed. The electrical current through the transistor is determined by the pH-dependent surface potential at the gate insulator. ISFETs offer several advantages over traditional pH glass electrodes, including smaller footprint, faster response times, and the durability. And ISFET is also benefiting from CMOS technology's inherent capabilities to develop affordable, disposable, miniaturized, and low-power sensing systems.

However, ISFETs have several drawbacks, including high fabrication costs that require clean room facilities, expensive packaging for the silicon substrate, and long-term drift influenced by the gate insulator material. Additionally, the need for a large, fragile glass reference electrode undermines many of ISFET's advantages. To overcome these limitations, differential sensing combined with a common reference electrode is disclosed in the present invention, which eliminates the need for a glass reference electrode and compensates for signal drift from the disturbance of testing environment. An Extended Gate Field Effect Transistor (EGFET) is a type of ISFET in which the gate terminal of a Metal-Oxide Semiconductor Field-Effect Transistor (MOSFET) is connected to a hydrogen ion sensing materials such as metal oxides. One of the popular metal oxide materials is the indium tin oxide (ITO). By placing a hydrogen ion sensing film near a reference electrode and connecting it to the MOSFET's gate terminal, an electrochemical cell is formed. Changes of pH value in the aqueous solution lead to variations in the accumulation of hydrogen ions on the ITO surface, which in turn alters the surface potential. This approach enables the creation of a very low-cost pH sensor without requiring further clean room processes. EGFETs also offer advantages over ISFETs, such as simpler packaging, the ability to fabricate the sensing element separately from the MOSFET, and lower costs, making them suitable for disposable applications.

The MEMS pH sensor disclosed in the current invention eliminates the need for costly complex semiconductor processes and supports differential sensing. One advantage of the embodiment is that the differential interface circuitry maintains constant drain-source voltage and drain current in the MOSFETs, and therefore the gate-source voltage of MOSFET is directly reflecting the measured pH value. One of the embodiments in the current invention, we present a differential input pH sensor that reduces complexity, size, and power consumption. The sensor employs two distinct sensing areas for sensing hydrogen ions concentration to generate two electrical potentials as inputs to the gate terminals of two identical MOSFETs. These two different sensing areas treat the pH solution as a differential input, which can eliminate the need for separating solution chambers for differential measurements. Another embodiment in the current invention is the integration with a common reference electrode, which enables the use of two EGFETs in the same electrolyte, and therefore the differential sensing measurements can be realized to reject common signals between two inputs, and help minimize the effects of drift, noise, and temperature variations. Conventional pH sensor system usually requires significant complex reference electrode, which is significantly adding complexity and cost to the system. On the contrary, in the embodiment of the current invention, the common reference electrode is integrated into the MEMS pH sensing chip together with the two hydrogen ion sensing electrodes. The integration for the hydrogen ion sensing electrodes and the common reference electrode on the same substrate will efficiently reduce the footprint of the whole pH sensor which is essential to the portable and implantable applications that needs low power consumption as well.

In the current invention, a low cost MEMS pH sensor with external gate field effect transistors and a common reference electrode is disclosed. The sensor utilizes two distinct ion sensing electrodes integrated with a common reference electrode to reduce complexity and power consumption, and make it well-suited for many applications. The common reference electrode formed by a thin film of noble metal is designed for differential sensing, and help mitigate long-term drift, common-mode disturbances, and to eliminate the need for a glass or solid state reference electrode.

BRIEF DESCRIPTIONS OF THE DRAWINGS

FIG. 1—is a schematic top view of the completed MEMS PH sensing chip.

Figure 2:
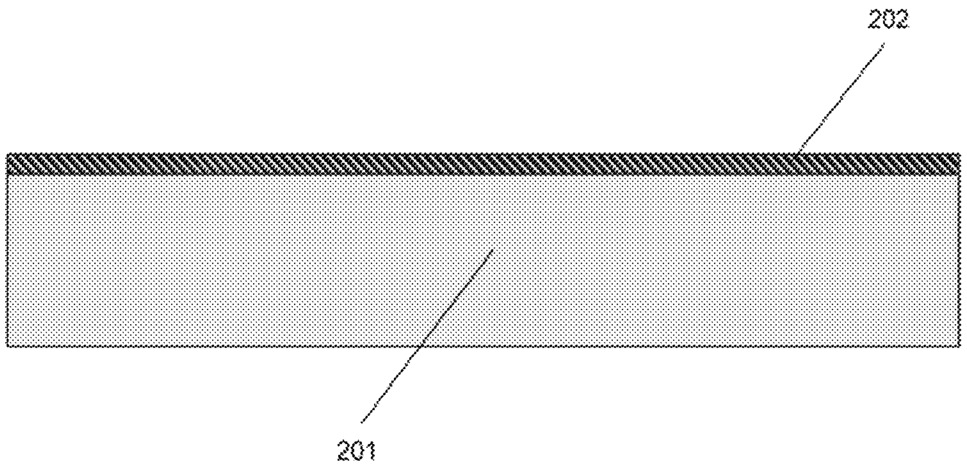

FIG. 2—is a cross section view of the starting substrate along the long edge of the MEMS pH sensing chip after plasma enhanced chemical vapor deposition (PECVD) of silicon nitride film on top surface of the substrate as an ion diffusion barrier.

Figure 3:
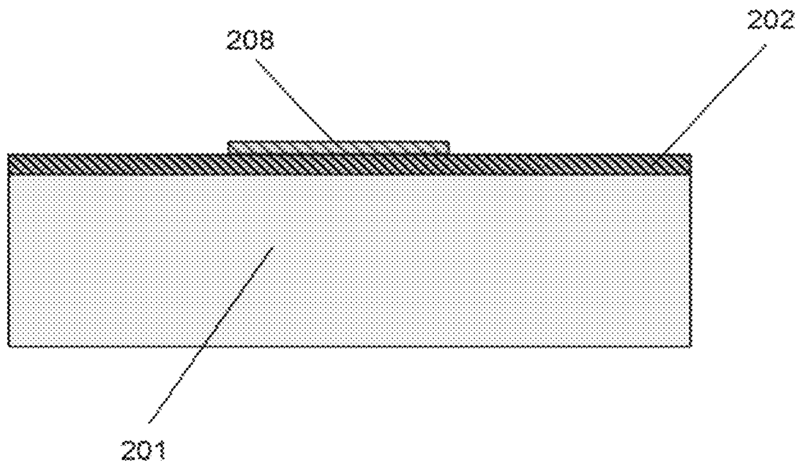

FIG. 3—is a cross section view along the short edge of the MEMS pH sensing chip after the first metal system deposition on the top surface of the substrate and perform a first photolithography process and a first etch process for the first metal film system to define a pattern of a common reference electrode.

Figure 4:
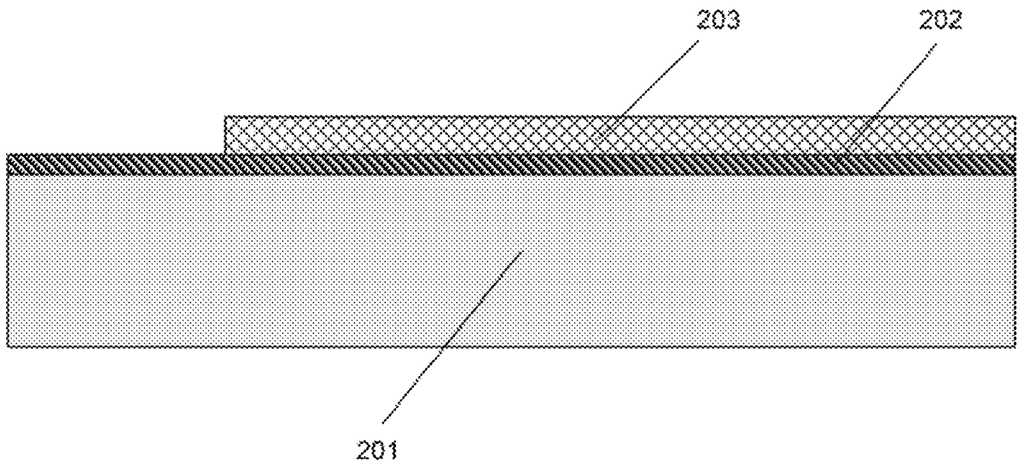
Figure 5:
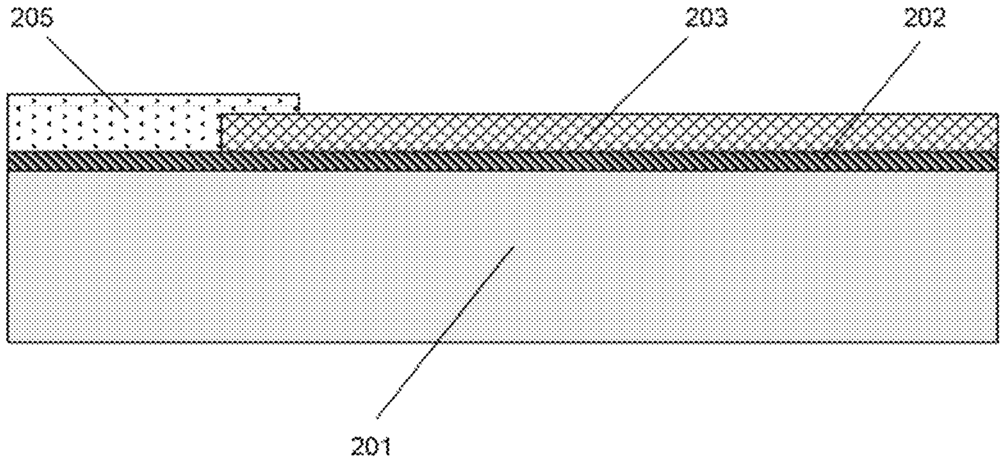

FIG. 4—is a cross section view along the short edge of the MEMS pH sensing chip after depositing a second metal film system on the top surface of the substrate and performing a second photolithography process and a second etching process for the second metal film system to define a pattern of a metal interconnection;

FIG. 5—is a cross section view along the short edge of the MEMS pH sensing chip after depositing a third metal film system on the top surface of the substrate and performing a third photolithography process and a third etch process for the third metal film system to define a pattern of bonding pads.

Figure 6:
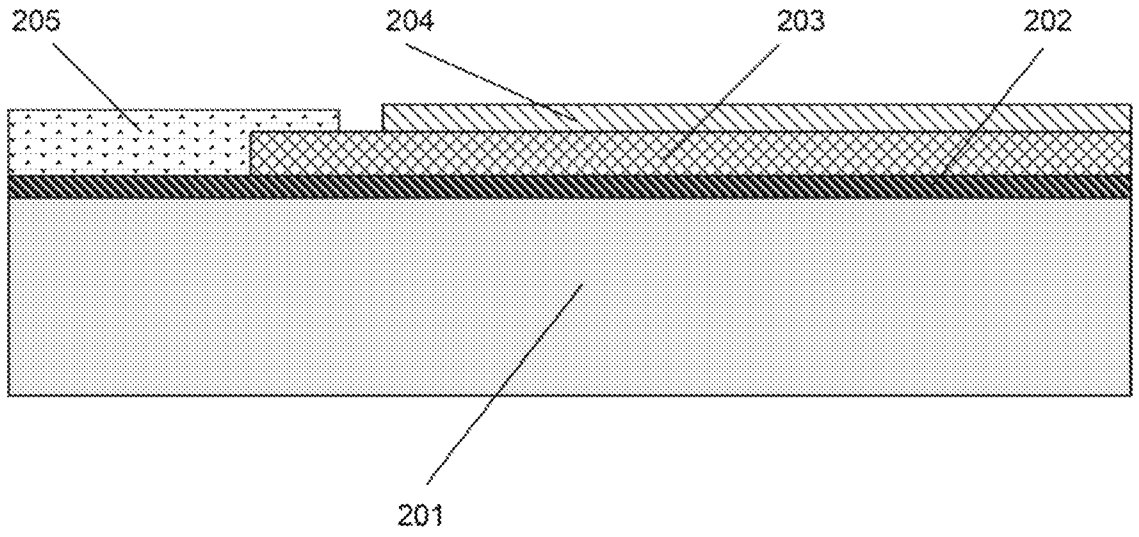

FIG. 6—is a cross section view along the short edge of the MEMS pH sensing chip after depositing an hydrogen ion sensitive film on the top surface of the substrate, which is used to sense dissolved hydrogen ions in an aqueous solution, and performing a fourth photolithography process and a fourth etch process and define patterns of the ion sensitive layer to be two distinct sensing areas with different dimensions.

Figure 7:
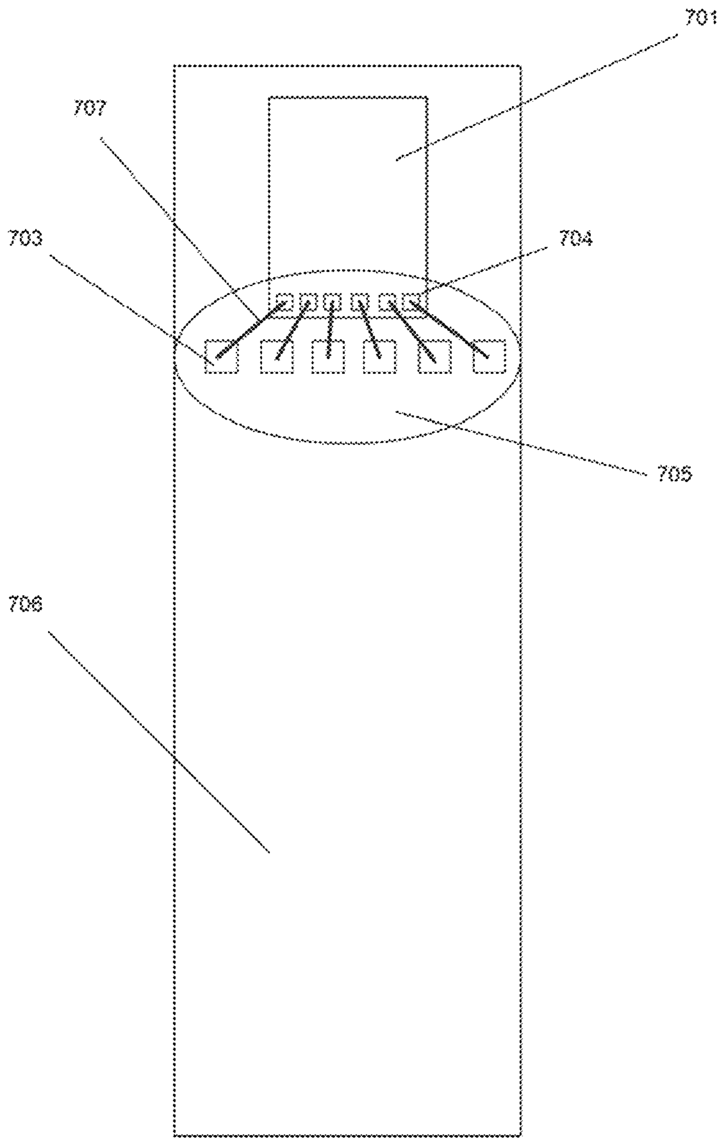

FIG. 7—is a top view of the MEMS pH sensing chip wire bonded and attached on top of a ceramic carrier PCB.

Figure 8:
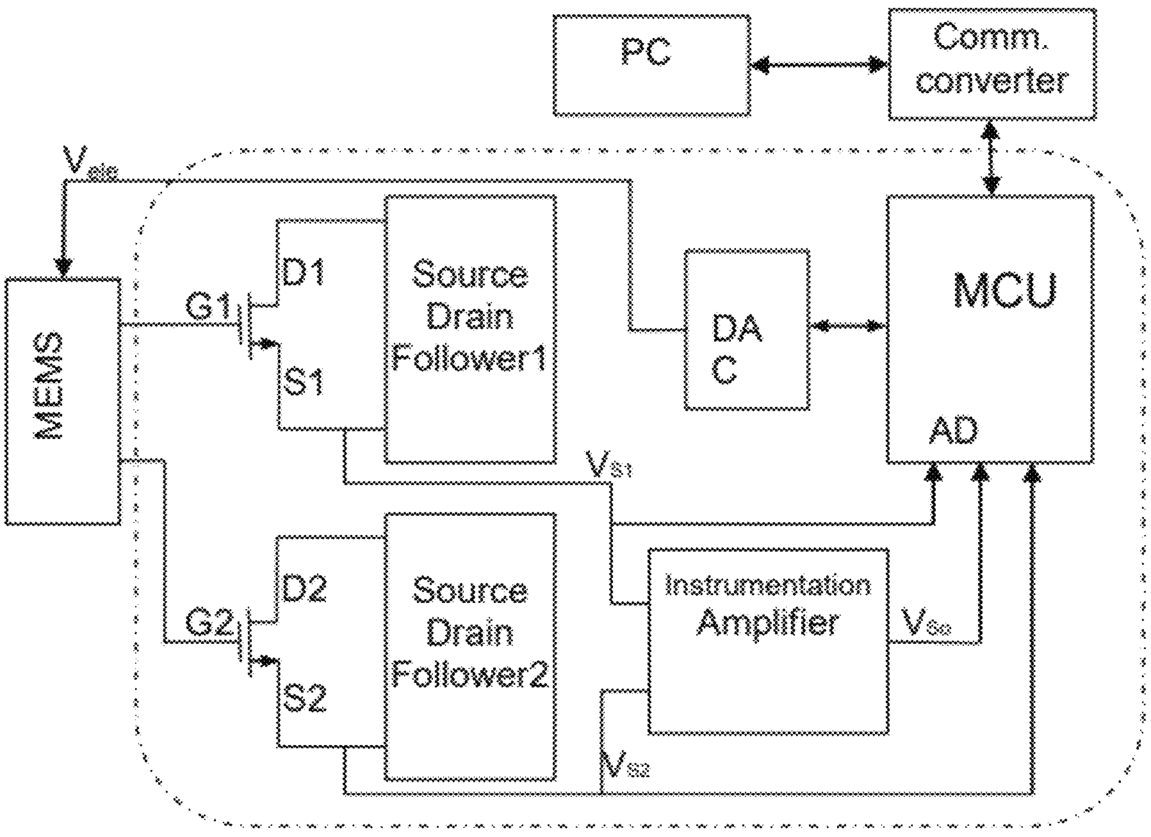

FIG. 8—is a block diagram to show the differential interface circuitry with two identical metal oxide semiconductor field effect transistors (MOSFETs).

DETAILED DESCRIPTION OF THE PREFERRED EMBODIMENTS

In the current invention, FIG. 1 shows a schematic top view of the completed MEMS pH sensing chip. 208 is a common reference electrode formed by a noble metal. 204 is the hydrogen ion sensing film patterned to be two distinct areas. The size ratio between two distinct areas is ranged from 2 to 15 depending on which kind of hydrogen ion sensing film is used. The hydrogen ion sensing material is usually a metal oxide film which can selected from tin oxide ($SnO_2$), indium tin oxide (ITO), aluminum oxide ($Al_2O_3$), tantalum oxide ($Ta_2O_5$), and tungsten oxide ($WO_3$). The metal oxide film will accumulate the hydrogen ions to form a potential which will be connected the gate terminal of the MOSFET. The underneath layer of the hydrogen ion sensing film is a metal connection layer which is used to transfer the electrical potential on the hydrogen ion sensing film. 205 are metal pads on the MEM pH sensing chip which are used for wire bonding to the carrier PCB.

FIG. 2 is a is a cross section view of the started substrate 201 along the long edge of the MEMS pH sensing chip after plasma enhanced chemical vapor deposition (PECVD) of silicon nitride film 202 on top surface of the substrate as an ion diffusion barrier. The thickness of the ion diffusion barrier PECVD silicon nitride film 202 is ranged from 500 nm to 1000 nm.

FIG. 3—is a cross section view along the short edge of the MEMS pH sensing chip after the first metal system deposition on the top surface of the ion diffusion barrier silicon nitride 202. Both photolithography and etching process are performed to define a pattern of a common reference electrode 208. The material for the common reference electrode can be selected from gold, silver, palladium, iridium, and platinum. The noble metal can prevent the electrode from corrosion induced by acidic and alkaline solutions. A great advantage of the current embodiment of the metal common reference electrode 208 is that it is to replace a fragile and complex glass reference electrode and other complicated solid state electrodes because the potential variation of the common reference electrode caused by pH value or temperature variation is cancelled, which is benefited by the differential interface circuitry design.

FIG. 4 is a cross section view along the short edge of the MEMS pH sensing chip after depositing a second metal film system on top of the silicon nitride film 202, and then performs a second photolithography process and a second etching process to define a pattern of a metal interconnection 203. The metal film for the metal interconnection 203 is selected from gold, copper or aluminum. FIG. 5 is a cross section view along the short edge of the MEMS pH sensing chip after depositing a third metal film system on the top surface of the silicon nitride film 202, and then performs a third photolithography process and a third etching process for the third metal film system to define a pattern of bonding pads 205. FIG. 6 is a cross section view of the complete MEMS pH sensing chip along the short edge of the MEMS pH sensing chip after depositing hydrogen ion sensing film 204 on the top surface of the metal interconnection 203 and, then performs a fourth photolithography process and a fourth etching process to define patterns of the hydrogen ion sensing film. The hydrogen ion film 204 is patterned to become two distinct sensing areas with different sizes. The pattern of the hydrogen ion sensing film 204 needs to completely cover the pattern of metal interconnection 203 since the acidic or alkaline solution may attack and damage the metal interconnection 203. The hydrogen ion sensing film 204 is used to sense dissolved hydrogen ions in the aqueous solution and form an accumulated hydrogen ion charge potential.

FIG. 7 is a schematic top view of the MEMS pH sensing chip 701 which is wire bonded and attached on top of a ceramic carrier PCB 706. The bonding wires are bonded from the bonding pads 704 of the MEMS pH sensing chip 701 to the other bonding pads 703 of the ceramic carrier PCB 706. An epoxy material 705 needs to apply and cover the entire region that includes the bonding pads of MEMS pH ion sensing chip and carrier PCB, and the bonding wires to avoid corrosion from the testing solutions. The carrier PCB is made of ceramic material to avoid the corrosion effects from the acidic or alkaline solutions.

FIG. 8 is a block diagram to demonstrate the differential interface circuitry with two identical metal oxide semiconductor field effect transistors (MOSFETs). The MEMS pH sensing chip will provide two electric potentials to the gate terminals (G1 & G2) of the two identical MOSFETs which will provide two outputs of $V_{s1}$ and $V_{s2}$. The $V_{s1}$ and $V_{s2}$ will then input to an instrumentation amplifier for the differential operation and provide an output to a microcontroller unit (MCU) for analog to digital conversion and digital data processing.

The invention has been described based on what are currently considered the most practical and preferred embodiments. However, it should be understood that the invention is not confined to these specific embodiments. Instead, it is intended to encompass various modifications and similar arrangements that fall within the spirit and scope of the appended claims. These claims should be interpreted broadly to include all such modifications and equivalent structures. Accordingly, the foregoing description and illustrations should not be viewed as limiting the scope of the invention, which is defined solely by the appended claims.

What is claimed is:

1. An MEMS PH sensor with external gate field effect transistors and common reference electrode comprising:

a MEMS pH sensing chip;

wherein a method for forming the MEMS pH sensing chip comprising steps of:

a) providing a substrate;

b) depositing a layer of silicon nitride film by plasma enhanced chemical vapor deposition (PECVD) on a top surface of the substrate;

c) depositing a first metal film system on the top surface of the substrate;

d) performing a first photolithography process and a first etch process for the first metal film system to define a pattern of a common reference electrode;

e) depositing a second metal film system on the top surface of the substrate;

f) performing a second photolithography process and a second etch process for the second metal film system to define a pattern of a metal interconnection;

g) depositing a third metal film system on the top surface of the substrate;

h) performing a third photolithography process and a third etch process for the third metal film system to define a pattern of bonding pads;

i) depositing an hydrogen ion sensitive film on the top surface of the substrate, which is used to sense dissolved hydrogen ions in an aqueous solution;

j) performing a fourth photolithography process and a fourth etch process on the hydrogen ion sensing film to be two distinct hydrogen ion sensing electrodes with different sizes;

a carrier printed circuit board (PCB) for the hydrogen ion sensing chip to be mounted on top; and a differential interface circuitry with two identical metal oxide semiconductor field effect transistors (MOSFETs).

2. The MEMS pH sensor with external gate field effect transistors and common reference electrode of claim 1, wherein the first silicon nitride film is used as a diffusion barrier to prevent other ions of the substrate diffusing into the ion sensitive layer to interfere an ion sensing activity.

3. The MEMS pH sensor with external gate field effect transistors and common reference electrode of claim 1, wherein the hydrogen ion sensitive film is selected from a group of materials: tin oxide ($SnO_2$), indium tin oxide (ITO), aluminum oxide ($Al_2O_3$), tantalum oxide ($Ta_2O_5$), and tungsten oxide ($WO_3$).

4. The MEMS pH sensor with external gate field effect transistors and common reference electrode of claim 1, wherein the hydrogen ion sensing film is etched to be the two distinct hydrogen ion sensing electrodes with different sizes; wherein an area ratio of the two distinct hydrogen ion sensing electrodes is ranged from 2 to 15.

5. The MEMS pH sensor with external gate field effect transistors and common reference electrode of claim 1, wherein the common reference electrode is a metal material selected from a group of noble metals: gold, silver, palladium, iridium, and platinum.

6. The MEMS pH sensor with external gate field effect transistors and common reference electrode of claim 1, wherein the metal interconnection is a metal material selected from a group of metals with low resistivity: aluminum, copper, and gold; and wherein a thickness of the metal interconnection layer is no less than 150 nm.

7. The MEMS pH sensor with external gate field effect transistors and common reference electrode of claim 1, wherein the bonding pads are formed by the metal selected from a group of metals: aluminum, platinum and gold; and wherein a thickness of the bonding pads layer is no less than 200 nm.

8. The MEMS pH sensor with external gate field effect transistors and common reference electrode of claim 1, wherein the carrier print circuit board (PCB) for the MEMS pH sensing chip is made of ceramic material to avoid corrosion effect from strongly acidic or alkaline solution.

9. The MEMS pH sensor with external gate field effect transistors and common reference electrode of claim 1, wherein the carrier PCB has electroplated gold bonding pads; wherein an epoxy is applied to bonding wires between the bonding pads of the MEMS pH sensing chip and the electroplated gold bonding pads of carrier PCB to prevent corrosion from the strongly acidic or alkaline solutions.

10. The MEMS pH sensor with external gate field effect transistors and common reference electrode of claim 9, wherein the epoxy is covered whole areas of bonding pads on both MEMS pH sensing chip and the carrier PCB to prevent short circuitry due to exposing to the acidic or alkaline solutions.

11. The MEMS pH sensor with external gate field effect transistors and common reference electrode of claim 1, wherein each sensing area of the two distinct ion sensing electrodes of the hydrogen ion sensing film is respectively and separately connected to a gate terminal of each one of the two identical metal oxide field effect transistors (MOSFETs).

12. The MEMS pH sensor with external gate field effect transistors and common reference electrode of claim 1, wherein the patterns of the hydrogen ion sensing film need to completely cover the underneath metal interconnection since the strongly acidic or alkaline solution may attack and damage the metal interconnection.

13. The MEMS pH sensor with external gate field effect transistors and common reference electrode of claim 1, wherein each of the two distinct ion sensing electrodes is forming an electric potential on the gate terminal of the MOSFET which is based on a various concentration of the hydrogen ion and a sensing area of the hydrogen ion sensing film.

14. The MEMS pH sensor with external gate field effect transistors and common reference electrode of claim 1, wherein the MEMS differential sensor employs two distinct sensing areas as inputs to the two MOSFETs, and the two distinct sensing areas treat the pH solution as a differential input, eliminating the need for post-processing or separate solution chambers for differential measurements.

15. The MEMS pH sensor with external gate field effect transistors and common reference electrode of claim 1 wherein the differential inputs of the two gate terminals of the MOSFETs creates a potential output from the differential interface circuitry, which is used to calibrate as a pH value of the aqueous solution.

16. The MEMS pH sensor with external gate field effect transistors and common reference electrode of claim 1, wherein any electric potential fluctuations on the common reference electrode caused by a solution condition's change is cancelled out due to the differential interface circuitry design, and help mitigate long-term drift, common-mode disturbances, and eliminating the need for a glass reference or other complex solid state reference electrodes.

* * * * *